(12) United States Patent
Liu et al.

(10) Patent No.: US 11,024,954 B2
(45) Date of Patent: Jun. 1, 2021

(54) SEMICONDUCTOR PACKAGE WITH ANTENNA AND FABRICATION METHOD THEREOF

(71) Applicant: MediaTek Inc., Hsin-Chu (TW)

(72) Inventors: Nai-Wei Liu, Hsin-Chu (TW); Yen-Yao Chi, Hsin-Chu (TW); Tzu-Hung Lin, Hsin-Chu (TW); Wen-Sung Hsu, Hsin-Chu (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 16/399,659

(22) Filed: Apr. 30, 2019

(65) Prior Publication Data

US 2019/0348756 A1   Nov. 14, 2019

Related U.S. Application Data

(60) Provisional application No. 62/670,924, filed on May 14, 2018.

(51) Int. Cl.
*H01Q 1/38* (2006.01)
*H01Q 9/16* (2006.01)
(Continued)

(52) U.S. Cl.
CPC .............. *H01Q 1/38* (2013.01); *H01L 21/561* (2013.01); *H01L 23/66* (2013.01); *H01L 24/02* (2013.01);
(Continued)

(58) Field of Classification Search
CPC .......... H01Q 1/38; H01Q 9/16; H01L 21/561; H01L 23/66; H01L 24/02; H01L 24/13;
(Continued)

(56) References Cited

U.S. PATENT DOCUMENTS 8,890,284 B2   11/2014   Kilger et al.
8,952,521 B2    2/2015   Wojnowski et al.
(Continued)

FOREIGN PATENT DOCUMENTS

EP   3091571 A2   11/2016
EP   3413347 A1   12/2018
(Continued)

OTHER PUBLICATIONS

Extended European Search Report dated Nov. 5, 2019 in connection with European Application No. 19173432.6.
(Continued)

*Primary Examiner* — Jimmy T Vu
(74) *Attorney, Agent, or Firm* — Wolf, Greenfield & Sacks, P.C.

(57) ABSTRACT

A method of forming a semiconductor package structure includes providing a first wafer-level package structure having a die region surrounded by a scribe line region. The first wafer-level package structure includes a first encapsulating layer, a first redistribution layer (RDL) structure formed on the first encapsulating layer, a first antenna element formed in the first RDL structure and corresponding to the die region, and a semiconductor die in the first encapsulating layer and corresponding to the die region. A second wafer-level package structure is bonded onto the first RDL structure using a first adhesive layer. The second wafer-level package structure includes a second encapsulating layer attached to the first adhesive layer, and a second antenna element formed on the second encapsulating layer. The second antenna element and the first antenna element form a pitch antenna after the bonding of the second wafer-level package structure.

25 Claims, 7 Drawing Sheets

(51) Int. Cl.
   *H01L 23/00*    (2006.01)
   *H01L 21/56*    (2006.01)
   *H01L 23/66*    (2006.01)

(52) U.S. Cl.
   CPC .............. *H01L 24/13* (2013.01); *H01Q 9/16* (2013.01); *H01L 2223/6677* (2013.01); *H01L 2224/02331* (2013.01); *H01L 2224/02379* (2013.01); *H01L 2224/02381* (2013.01); *H01L 2224/13024* (2013.01)

(58) Field of Classification Search
   CPC ... H01L 2223/6677; H01L 2224/02331; H01L 2224/02379; H01L 2224/02381; H01L 2224/13024
   See application file for complete search history.

(56) References Cited

U.S. PATENT DOCUMENTS

| | | | |
|---|---|---|---|
| 9,935,065 | B1 | 4/2018 | Baheti et al. |
| 10,157,834 | B1 | 12/2018 | Tang et al. |
| 10,468,355 | B2 | 11/2019 | Wu et al. |
| 10,483,617 | B2 | 11/2019 | Chuang et al. |
| 10,510,693 | B2 | 12/2019 | Wu et al. |
| 10,629,539 | B2 | 4/2020 | Liang et al. |
| 10,770,795 | B2 | 9/2020 | Wang et al. |
| 2007/0029667 | A1 | 2/2007 | Fujii et al. |
| 2014/0035097 | A1 | 2/2014 | Lin et al. |
| 2015/0340765 | A1* | 11/2015 | Dang ................ H01Q 21/0075 343/893 |
| 2016/0104940 | A1* | 4/2016 | Wang ................ H01Q 1/2283 343/836 |
| 2016/0218072 | A1 | 7/2016 | Liao et al. |
| 2016/0329299 | A1 | 11/2016 | Lin et al. |
| 2017/0033468 | A1 | 2/2017 | Wong |
| 2017/0140266 | A1 | 5/2017 | Wang et al. |
| 2017/0345761 | A1 | 11/2017 | Yu et al. |
| 2017/0346185 | A1 | 11/2017 | Wang et al. |
| 2018/0025999 | A1 | 1/2018 | Yu et al. |
| 2018/0034134 | A1 | 2/2018 | Dalmia |
| 2018/0166405 | A1 | 6/2018 | Chiang et al. |
| 2018/0247905 | A1 | 8/2018 | Yu et al. |
| 2018/0331041 | A1 | 11/2018 | Liao et al. |
| 2019/0027449 | A1 | 1/2019 | Wan et al. |
| 2019/0035737 | A1 | 1/2019 | Wu et al. |
| 2019/0096829 | A1 | 3/2019 | Tang et al. |
| 2019/0103652 | A1 | 4/2019 | Chuang et al. |
| 2019/0181096 | A1* | 6/2019 | Wu ...................... H01L 21/486 |
| 2019/0181104 | A1 | 6/2019 | Chen et al. |
| 2019/0348747 | A1 | 11/2019 | Liu et al. |
| 2019/0348748 | A1 | 11/2019 | Liu et al. |
| 2020/0220250 | A1 | 7/2020 | Chih et al. |
| 2020/0258799 | A1 | 8/2020 | Chiang et al. |

FOREIGN PATENT DOCUMENTS

| | | |
|---|---|---|
| TW | 201906233 A | 2/2019 |
| WO | WO 2015/088486 A1 | 6/2015 |
| WO | WO 2018/004684 A1 | 1/2018 |

OTHER PUBLICATIONS

Extended European Search Report dated Oct. 21, 2019 in connection with European Application No. 19173046.4.
Extended European Search Report dated Oct. 30, 2019 in connection with European Application No. 19173166.0.
U.S. Appl. No. 16/387,354, filed Apr. 17, 2019, Liu et al.
U.S. Appl. No. 16/387,306, filed Apr. 17, 2019, Liu et al.
EP19173046.4, Oct. 21, 2019, Extended European Search Report.
EP19173166.0, Oct. 30, 2019, Extended European Search Report.

* cited by examiner

SEMICONDUCTOR PACKAGE WITH ANTENNA AND FABRICATION METHOD THEREOF

CROSS REFERENCE TO RELATED APPLICATIONS

This application claims the benefit of U.S. Provisional Application No. 62/670,924 filed on May 14, 2018, entitled "INNOVATIVE PROCESS FOR ANTENNA FAN OUT PACKAGE," the entirety of which is incorporated by reference herein.

BACKGROUND OF THE INVENTION

Field of the Invention

The present invention relates to a semiconductor package structure, and in particular to a fan-out semiconductor package including antennas and methods for forming the same.

Description of the Related Art

In order to ensure the continued miniaturization and multi-functionality of electronic products and communication devices, semiconductor packages must be small in size, support multi-pin connection, operate at high speeds, and have high functionality. Additionally, in a high-frequency application such as a radio frequency (RF) system-in-package (SiP) assembly, antennas are typically used for enabling wireless communication.

When wireless communication packages with antennas are constructed, package designs need to provide good antenna properties (such as high efficiency, wide bandwidth, etc.) while providing reliable and low-cost packaging solutions. In recent years, antenna-in-package (AiP) technology that implements an antenna (or antennas) integrated into a semiconductor package has been developed for reduction of the device size.

However, AiP technology still faces many challenges, and therefore an improved method for fabricating a semiconductor package with antennas is desired.

BRIEF SUMMARY OF THE INVENTION

Semiconductor package structures and methods of forming the same are provided. An exemplary embodiment of a method of forming a semiconductor package structure includes providing a first wafer-level package structure having a scribe line region and a die region surrounded by the scribe line region. The first wafer-level package structure includes a first encapsulating layer having a first surface and a second surface opposite to the first surface, a first redistribution layer (RDL) structure formed on the second surface of the first encapsulating layer, a first antenna element formed in the first RDL structure and corresponding to the die region, and a semiconductor die in the first encapsulating layer and corresponding to the die region. A second wafer-level package structure is bonded onto the first RDL structure using a first adhesive layer. The second wafer-level package structure includes a second encapsulating layer having a third surface attached to the first adhesive layer and a fourth surface opposite to the third surface, and a second antenna element formed on the fourth surface of the second encapsulating layer. The second antenna element and the first antenna element form a pitch antenna after the bonding of the second wafer-level package structure.

Another exemplary embodiment of a method of forming a semiconductor package structure includes providing a wafer-level package structure having die regions and a scribe line region separating the die regions from each other. The wafer-level package structure includes a first encapsulating layer having a first surface and a second surface opposite to the first surface, a first RDL structure formed on the second surface of the first encapsulating layer, semiconductor dies in the first encapsulating layer and respectively corresponding to the die regions, and first antenna elements formed in the first RDL structure and respectively corresponding to the die regions. At least one package unit is bonded onto the first RDL structure using a first adhesive layer. The package unit is within one of the die regions and includes a second encapsulating layer having a third surface attached to the first adhesive layer and a fourth surface opposite to the third surface, and a second antenna element formed on the fourth surface of the second encapsulating layer. The second antenna element and the first antenna element form a pitch antenna after the bonding of the package unit.

An exemplary embodiment of a semiconductor package structure includes a first molding compound material layer having a first surface and a second surface opposite to the first surface. The semiconductor package structure also includes a semiconductor die in the first molding compound material layer and a first redistribution layer (RDL) structure formed on the second surface of the first molding compound material layer and covering the semiconductor die. The semiconductor package structure also includes a second molding compound material layer formed on the first molding compound material layer and having a third surface and a fourth surface opposite to the third surface. The semiconductor package structure also includes a first adhesive layer attached to the first RDL structure and the third surface of the second molding compound material layer, and a pitch antenna electrically coupled to the semiconductor die. The pitch antenna includes a first antenna element formed in the first RDL structure, and a second antenna element formed on the fourth surface of the second molding compound layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
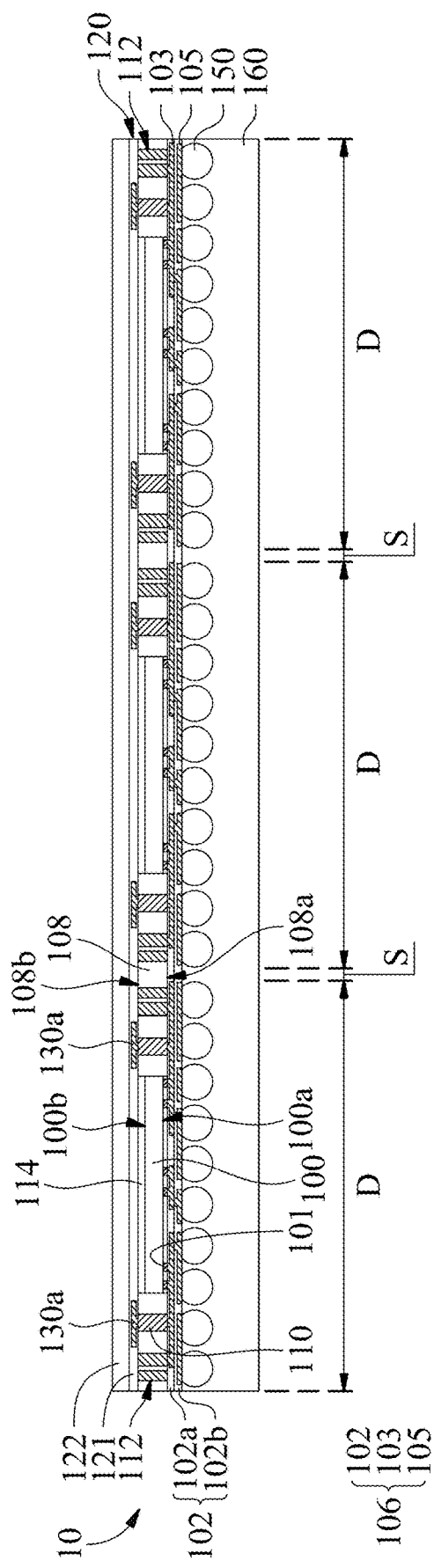
FIGS. 1A to 1D are a cross-sectional view of an exemplary method of forming a semiconductor package structure in accordance with some embodiments.

The following description is of the best-contemplated mode of carrying out the invention. This description is made for the purpose of illustrating the general principles of the invention and should not be taken in a limiting sense. The scope of the invention is determined by reference to the appended claims.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIGS. 1A to 1D is a cross-sectional view of an exemplary method of forming a semiconductor package structure in accordance with some embodiments. As shown in FIG. 1A, a wafer-level package structure 10 is provided. The wafer-level package structure 10 has die regions (which are also referred to as chip regions) and a scribe line region surrounding those die regions, so as to separate the adjacent die regions from each other. To simplify the diagram, only two complete die regions D and a scribe line region S separating these die regions D are depicted herein. In some embodiments, the wafer-level package structure 10 is a flip-chip semiconductor package structure.

In some embodiments, the wafer-level package structure 10 includes an encapsulating layer 108 having a bottom surface 108a and a top surface 108b opposite to the bottom surface 108a. In some embodiments, the encapsulating layer 108 may be made of a molding compound material, such as an epoxy, a resin, a moldable polymer, or the like. In those cases, the encapsulating layer 108 may be applied while substantially liquid, and then may be cured through a chemical reaction. In some other embodiments, the encapsulating layer 108 is an ultraviolet (UV) or thermally cured polymer applied as a gel or malleable solid capable of being disposed around semiconductor dies, and then is cured through a UV or thermal curing process. The encapsulating layer 108 is cured with a mold (not shown).

In some embodiments, the wafer-level package structure 10 further includes semiconductor dies 100, such as system-on-chip (SOC) dies, disposed in the encapsulating layer 108, so that the sidewalls of the semiconductor dies 100 are surrounded by the encapsulating layer 108. The semiconductor dies 100 may respectively correspond to the die regions D. For example, each die region D includes at least one semiconductor die 100. The SOC die, for example, may include a microcontroller (MCU), a microprocessor (MPU), a power management integrated circuit (PMIC), a global positioning system (GPS) device, a radio frequency (RF) device, or any combination thereof.

In some embodiments, each of the semiconductor dies 100 has a first side and a second side opposite to the first side. More specifically, the first side of the semiconductor die 100 has an active surface 100a (which is also referred to as a front surface) and the second side of the semiconductor die 100 has a non-active surface 100b (which is also referred to as a rear surface) and an active surface 100a (which is also referred to as a front surface) opposite the non-active surface 100b. In some embodiments, the active surface 100a of the semiconductor die 100 corresponds to and adjacent to the bottom surface 108a of the encapsulating layer 108. The non-active surface 100b of the semiconductor die 100 corresponds to and adjacent to the top surface 108b of the encapsulating layer 108. Pads 101 of the semiconductor die 100 are disposed on the active surface 100a and electrically connected to the circuitry (not shown) of the semiconductor die 100.

In some embodiments, the wafer-level package structure 10 further includes a redistribution layer (RDL) structure 106 formed on the first surface 100a of the encapsulating layer 108 and covering the active surface 100a of each of the semiconductor dies 100. The RDL structure 106 is also referred to as a fan-out structure. The RDL structure 106 is electrically connected to each of the semiconductor dies 100 through the pads 101.

In some embodiments, the RDL structure 106 includes one or more conductive traces disposed in an inter-metal dielectric (IMD) layer 102. More specifically, in some embodiments, conductive traces 103 are disposed at a first layer-level of the IMD layer 102 and at least one of the conductive traces 103 is electrically coupled to the semiconductor die 100. Moreover, conductive traces 105 are disposed at a second layer-level that is different from the first layer-level of the IMD layer 102.

In some embodiments, the IMD layer 102 includes a first sub-dielectric layer 102a and a second sub-dielectric layer 102b successively stacked from the active surface 100a of each of the semiconductor dies 100, so that the conductive traces 103 are formed in the first sub-dielectric layer 102a, and the conductive traces 105 are formed in the second sub-dielectric layer 102b. It should be noted that the number of conductive traces and the number of sub-dielectric layers of the RDL structure 106 shown in FIG. 1A are only an example and are not a limitation to the present invention.

In some embodiments, the IMD layer 102 is made of an organic material, which includes a polymer base material, a non-organic material, which includes silicon nitride ($SiN_x$), silicon oxide ($SiO_x$), graphene, or the like. For example, the first sub-dielectric layers 102a and the second sub-dielectric layer 102b are made of a polymer base material. In some other embodiments, the IMD layer 102 is a high-k dielectric layer (k is the dielectric constant of the dielectric layer). In some other embodiments, the IMD layer 102 may be made of a photo sensitive material, which includes a dry film photoresist, or a taping film.

In some embodiments, the wafer-level package structure 10 includes conductive structures 150 formed on and electrically coupled to the RDL structure 106, so that the conductive structures 150 are separated from the encapsulating layer 108 and the semiconductor dies 100 through the RDL structure 106. As a result, the conductive structures 150 are free from contact with the encapsulating layer 108 and the semiconductor dies 100. In some embodiments, at least one of the conductive traces 105 in the RDL structure 106 is electrically coupled to one or more conductive structures 150, so that the conductive structures 150 are electrically coupled to the semiconductor die 100 via the RDL structure 106. Each of the conductive structures 150 may include a conductive bump structure such as a copper bump or a solder bump structure. Alternatively, each of the conductive structures 150 includes a conductive pillar structure, a conductive wire structure, or a conductive paste structure.

In some embodiments, the wafer-level package structure 10 further includes through via structures 110 (which are sometimes referred to as through insulator vias (TIVs)) formed in and passing through the encapsulating layer 108. The through via structures 110 may respectively correspond to the die regions D. For example, each die region D includes at least one through via structure 110. The through via structures 110 are electrically coupled to the conductive traces 103 of the RDL structure 106 and may be made of copper.

In some embodiments, the wafer-level package structure 10 further includes antennas 112 therein and electrically coupled to the semiconductor die 100. More specifically, in some embodiments, the antennas 112 are formed in the encapsulating layer 108. The antennas 112 may respectively correspond to the die regions D. For example, each die region D includes at least one antenna 112. In some embodiments, the antenna 112 is electrically coupled to the semiconductor die 100 via at least one of the conductive traces 103 of the RDL structure 106. In some embodiments, the antenna 112 is a dipole antenna. In some embodiments, the method and material used for forming the antenna 112 are the same as or similar to those of the through via structure 110.

In some embodiments, the wafer-level package structure 10 further includes an RDL structure 120 formed on the top surface 108*b* of the encapsulating layer 108 and covering the non-active surface 100*b* of each of the semiconductor dies 100. The RDL structure 120 may have a structure similar to the RDL structure 106 and is also referred to as a fan-out structure. In some embodiments, the non-active surface 100*b* of each of the semiconductor dies 100 is attached to the RDL structure 120 via an adhesive layer 114 (which is sometimes referred to as a die attach film), so that the semiconductor dies 100 and the encapsulating layer 108 are interposed between the RDL structure 106 and the RDL structure 120.

In some embodiments, the RDL structure 120 includes an IMD layer 121 and conductive traces (not shown) in the IMD layer 121. The IMD layer 121 may be a single layer or a multi-layer structure. The method and material used for forming the IMD layer 121 may be the same as or similar to those of the IMD layer 102. Similarly, the method and material used for forming the conductive traces of the RDL structure 120 may be the same as or similar to those of the conductive traces 103 and 105 of the RDL structure 106. In other words, the process for formation of the RDL structure 106 can be used for formation of the RDL structure 120.

In some embodiments, the wafer-level package structure 10 further includes first antenna elements 130*a* formed in the RDL structure 120. The first antenna elements 130*a* may respectively correspond to the die regions D. For example, each die region D includes at least one first antenna element 130*a*. In some embodiments, the first antenna element 130*a* corresponding to the die region D serve as a portion of a patch antenna that is subsequently formed over a corresponding semiconductor die 100.

In some embodiments, the first antenna element 130*a* is embedded in the IMD layer 121 of the RDL structure 120. In some embodiments, the through via structure 110 formed in the encapsulating layer 108 is electrically coupled between the first antenna element 130*a* and at least one of the conductive traces 103 of the RDL structure 106, so that the semiconductor die 100 is electrically coupled to the first antenna element 130*a*.

In some embodiments, the first antenna element 130*a* is made of at least one of the conductive traces in the RDL structure 120. In those cases, the method and material used for forming the first antenna element 130*a* may be the same as or similar to those of the conductive traces 103 and 105 in the IMD layer 102 of the RDL structure 106.

Figure 1B:
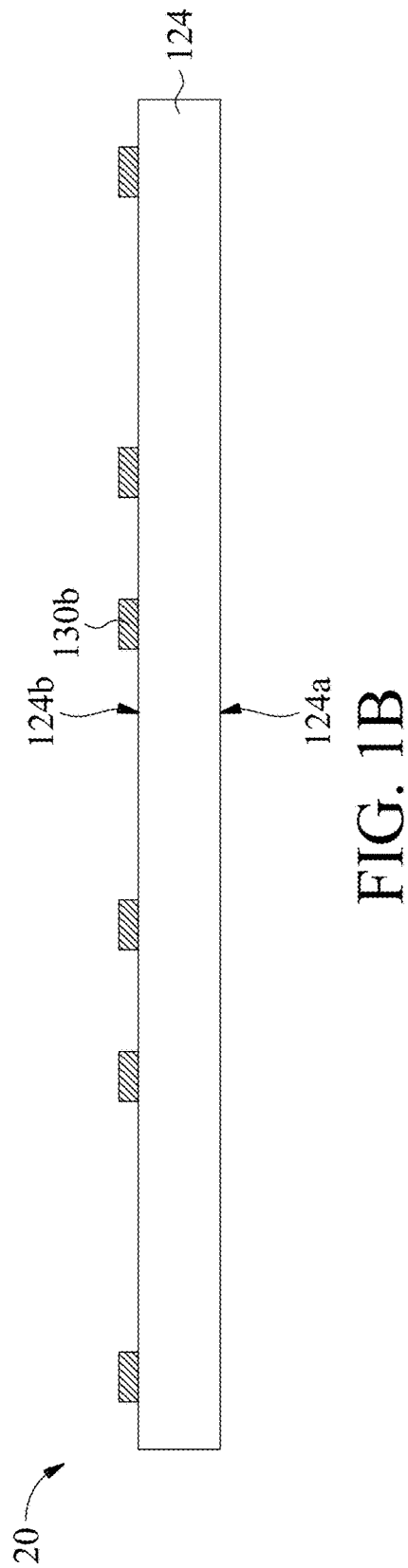

As shown in FIG. 1B, in some embodiments, a wafer-level package structure 20 is provided. The wafer-level package structure 20 includes an encapsulating layer 124 having a bottom surface 124*a* and a top surface 124*b* opposite to the bottom surface 124*a*.

In some embodiments, the encapsulating layer 124 is made of a material that is the same as or similar to that of the encapsulating layer 108. For example, the encapsulating layer 124 may be made of a molding compound material, such as an epoxy, a resin, a moldable polymer, or the like. The encapsulating layer 124 may be applied while substantially liquid, and then may be cured through a chemical reaction. In some other embodiments, the encapsulating layer 124 is an ultraviolet (UV) or thermally cured polymer applied as a gel or malleable solid capable of being disposed around semiconductor dies, and then is cured through a UV or thermal curing process. The encapsulating layer 124 is cured with a mold (not shown).

In some embodiments, the wafer-level package structure 20 further includes second antenna elements 130*b* formed on the top surface 124*b* of the encapsulating layer 124. In some embodiments, the second antenna element 130*b* is formed on and in direct contact with the encapsulating layer 124. In some embodiments, the second antenna element 130*b* may be made of a material that is the same as or similar to that of the first antenna element 130*a*.

Figure 1C:
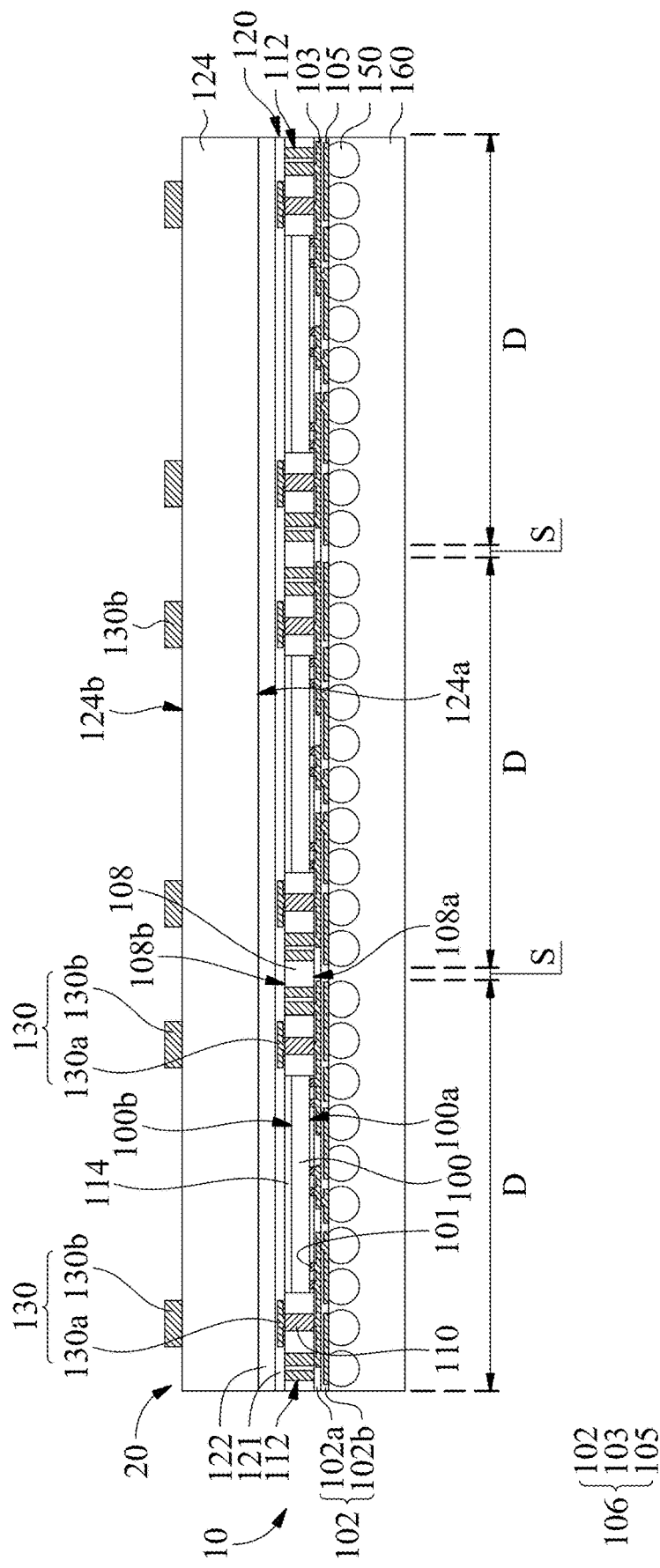

As shown in FIG. 1C, the wafer-level package structure 20 is bonded onto the RDL structure 120 of the wafer-level package structure 10 using an adhesive layer 122. Similar to the first antenna elements 130*a*, the second antenna elements 130*b* may respectively correspond to the die regions D after the wafer-level package structure 20 is bonded onto the wafer-level package structure 10. For example, each die region D includes at least one second antenna element 130*b* and corresponding to the first antenna element 130*a* after the bonding of the wafer-level package structure 20. In those cases, the second antenna element 130*b*, the corresponding first antenna element 130*a*, and the encapsulating layer 124 between the first antenna element 130*a* and the second antenna element 130*b* form an antenna structure in the corresponding die region D. The antenna structure is electrically coupled to the semiconductor die 100 in the corresponding die region D. In the antenna structure, each of the first antenna elements 130*a* and the corresponding second antenna element 130*b* form an antenna 130, such as a patch antenna. The encapsulating layer 124 between the first antenna element 130*a* and the second antenna element 130*b* serves as a resonator for the antenna 130 (e.g., the patch antenna).

In some embodiments, before the wafer-level package structure 20 is bonded onto the wafer-level package structure 10, a supporting layer 160 (e.g., a glue layer or a tape) is formed on the RDL structure 106 and covers the conductive structures 150, as shown in FIG. 1A. In some embodiments, the supporting layer 160 serves as a carrier to support the wafer-level package structure 10 during the bonding between the wafer-level package structure 10 and the wafer-level package structure 20. Moreover, the supporting layer 160 also serves as a protective layer to protect the conductive structures 150 during the bonding between the wafer-level package structure 10 and the wafer-level package structure 20.

In some embodiments, before the wafer-level package structure 20 is bonded onto the wafer-level package structure 10, the adhesive layer 122 is formed on the RDL structure 120 of the wafer-level package structure 10. Afterwards, the bottom surface 124*a* of the encapsulating layer 124 is attached to the adhesive layer 122, so as to bond the wafer-level package structure 20 onto the wafer-level package structure 10.

Alternatively, before the wafer-level package structure 20 is bonded onto the wafer-level package structure 10, the adhesive layer 122 is formed on the bottom surface 124*a* of the encapsulating layer 124. Afterwards, the adhesive layer 122 on the bottom surface 124*a* of the encapsulating layer 124 is attached to the RDL structure 120 of the wafer-level package structure 10, so as to bond the wafer-level package structure 20 onto the wafer-level package structure 10. After the wafer-level package structure 20 is bonded onto the wafer-level package structure 10, the supporting layer 160 is removed from the RDL structure 106.

Figure 1D:
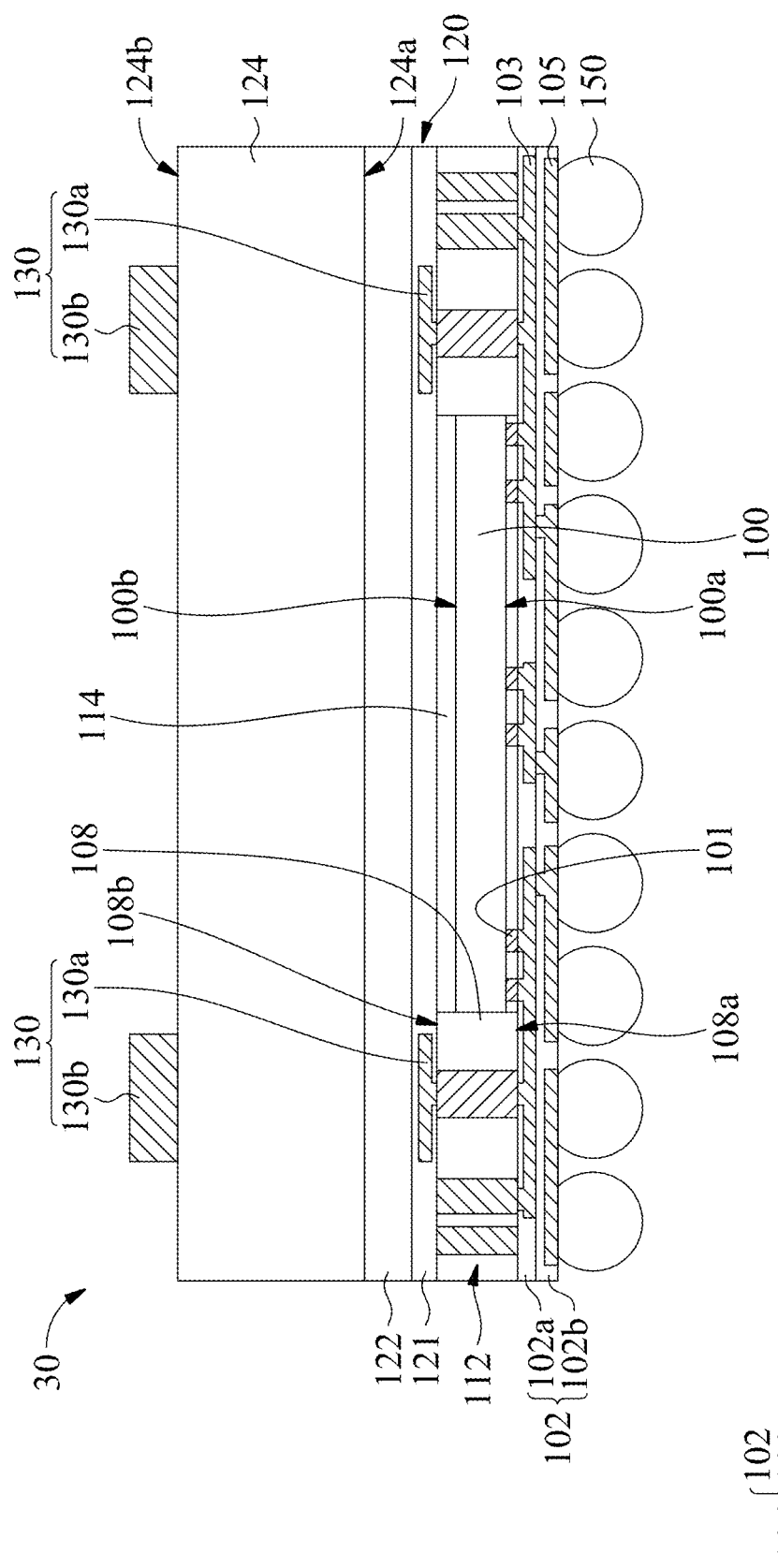

Afterwards, a singulation process (which is also referred to as a dicing process) is performed on the structure shown in FIG. 1C, to form individual semiconductor package structures. More specifically, the wafer-level package structures 10 and 20 and the adhesive layer 122 therebetween are diced along the scribe line region S, thereby separating each of the die regions D. For example, a dicing saw or laser may be used to perform the dicing process. After performing the singulation process, individual semiconductor package structures 30 are formed, and one of the semiconductor package structures 30 is depicted for simplifying the diagram, as shown in FIG. 1D. In some other embodiments, the supporting layer 160 is removed from the RDL structure 106 after performing the singulation process.

As shown in FIG. 1D, the semiconductor package structure 30 includes the encapsulating layer 108 (e.g., a molding compound material layer) having at least one semiconductor die 100, at least one through via structure 110, and at least one dipole antenna 112 therein. The redistribution layer (RDL) structures 106 and 120 are respectively formed on the bottom and top surfaces 108a and 108b of the encapsulating layer 108 and cover the semiconductor die 100. An adhesive layer 114 attaches the non-active surface 100b of the semiconductor die 100 to the RDL structure 120. Moreover, conductive structures 150 are formed on and electrically coupled to the RDL structure 106.

The semiconductor package structure 30 further includes the encapsulating layer 124 (e.g., a molding compound material layer) formed on the encapsulating layer 108 via the adhesive layer 122. The adhesive layer 122 is attached to the RDL structure 120 and the bottom surface 124a of the encapsulating layer 124. The semiconductor package structure 30 further includes at least one patch antenna 130 electrically coupled to the semiconductor die 100. The pitch antenna 130 includes the first antenna element 130a formed in the RDL structure 120 and the second antenna element 130b formed on the top surface 124b of the encapsulating layer 124.

In some embodiments, a sidewall of the encapsulating layer 108 is substantially aligned to a sidewall of the encapsulating layer 124 and a sidewall of the adhesive layer 122.

The semiconductor package structure 30 may be mounted on a base (not shown). For example, the semiconductor package structure 30 may be a system-on-chip (SOC) package structure. Moreover, the base may include a printed circuit board (PCB) and may be made of polypropylene (PP). Alternatively, the base is a package substrate and the semiconductor package structure 30 is mounted onto the base by a bonding process. In some embodiments, the conductive structures 150 of the semiconductor package structure 30 are mounted on and electrically coupled to the base by the bonding process.

Figure 2A:
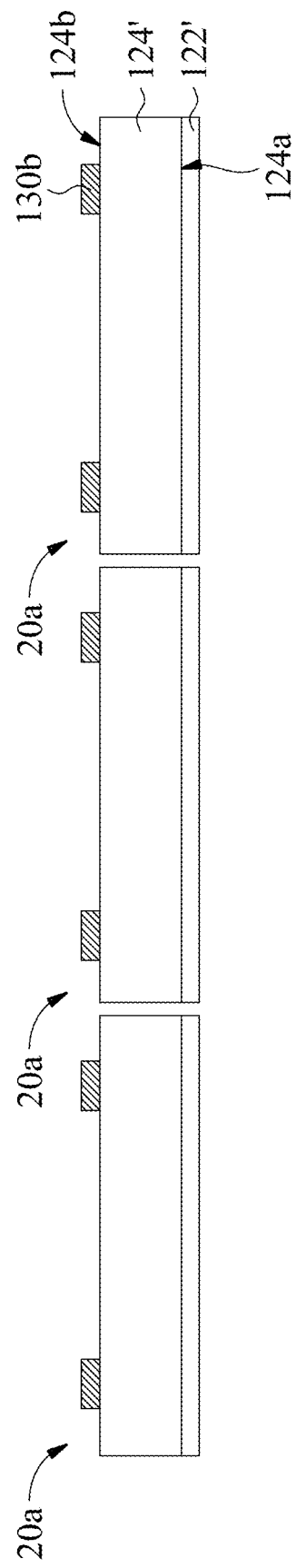
FIGS. 2A to 2C are a cross-sectional view of an exemplary method of forming a semiconductor package structure in accordance with some embodiments.
Figure 2B:
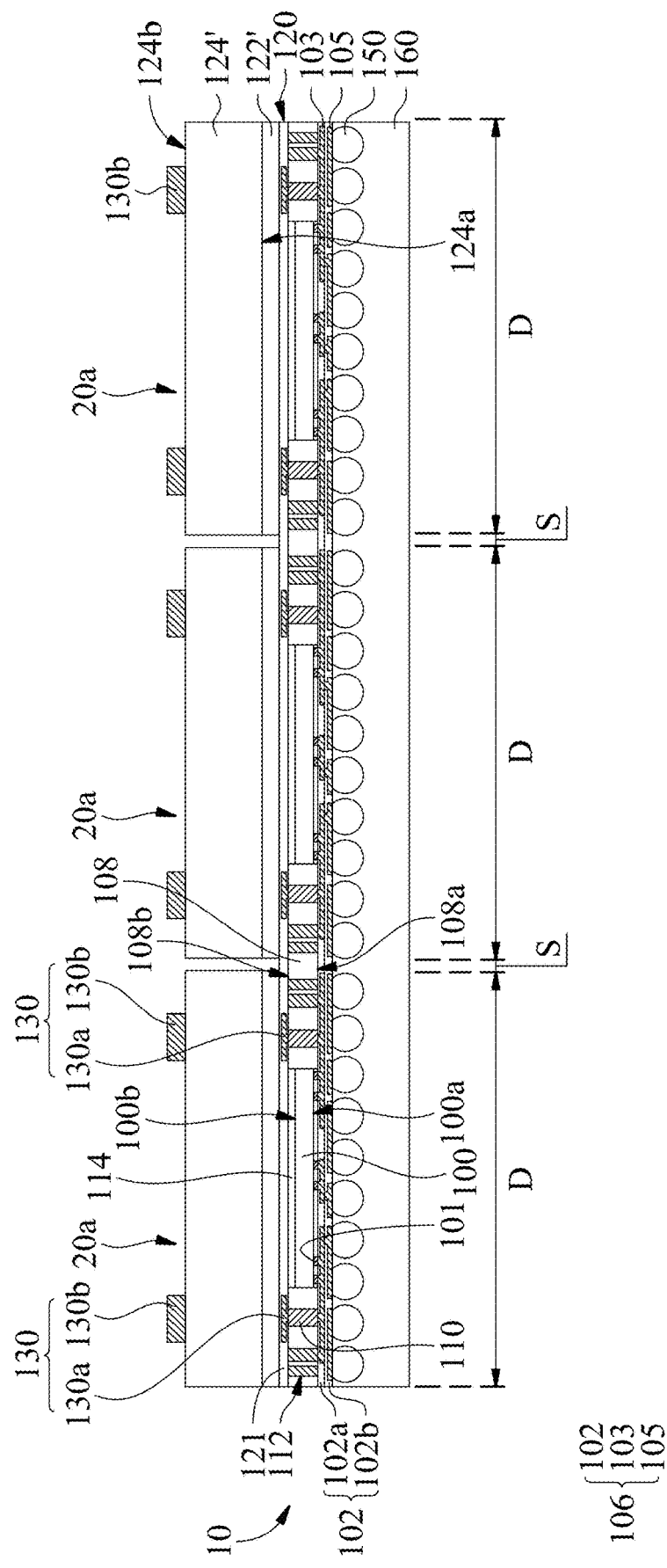
Figure 2C:
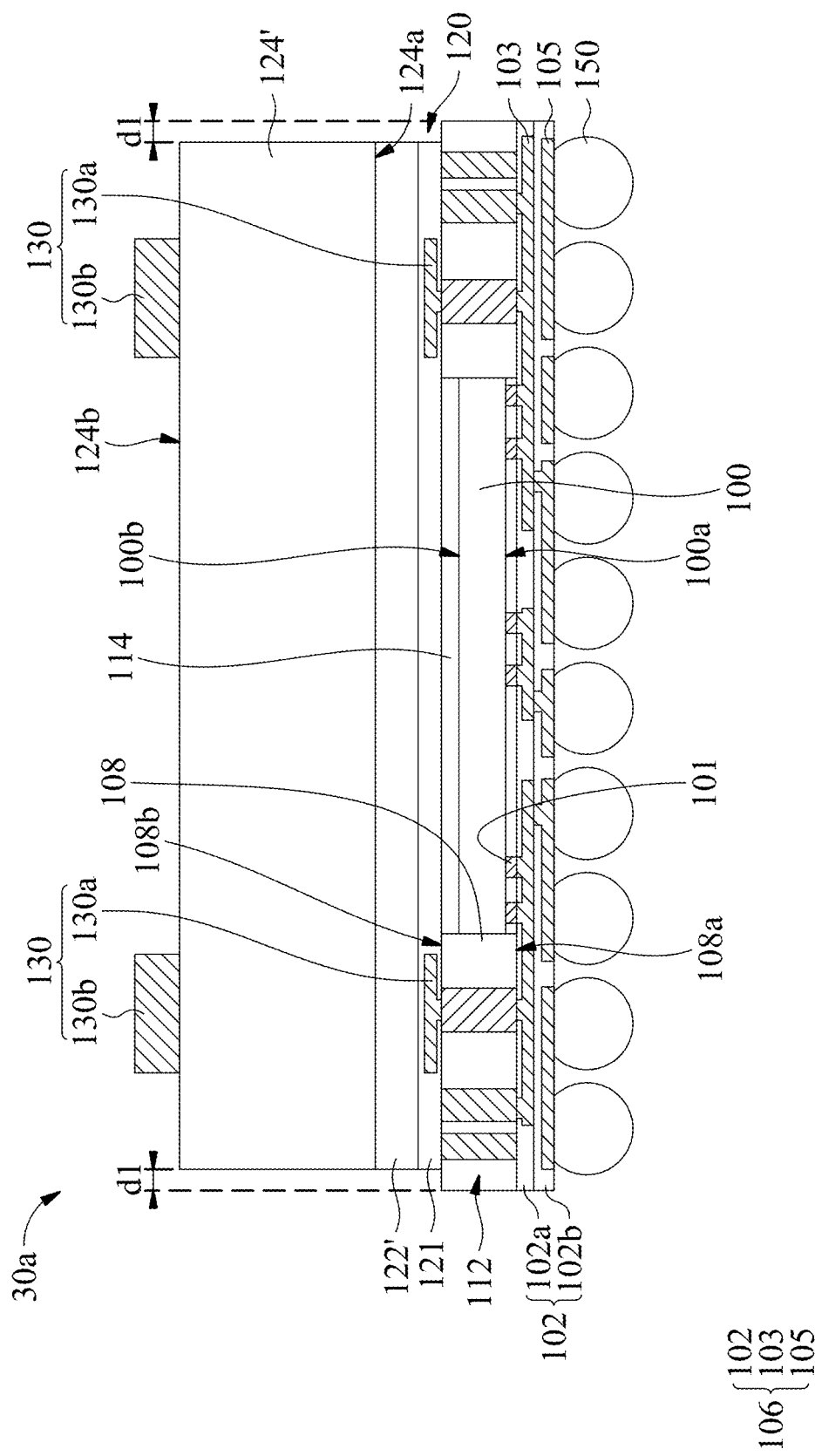

FIGS. 2A to 2C is a cross-sectional view of an exemplary method of forming a semiconductor package structure in accordance with some embodiments. Descriptions of elements of the embodiments that are the same as or similar to those previously described with reference to FIGS. 1A to 1D may hereinafter be omitted for brevity. As shown in FIG. 2A, package units 20a is provided. In some embodiments, the package units 20a are formed by dicing the wafer-level package structure 20 shown in FIG. 1B. Each of the package units 20a includes an encapsulating layer 124' formed by dicing the encapsulating layer 124 shown in FIG. 1B. Moreover, each of the package units 20a has a bottom surface 124a and a top surface 124b opposite to the bottom surface 124a, and at least one second antenna element 130b formed on the top surface of the encapsulating layer 124'.

As shown in FIG. 2B, the package units 20a are provided and bond onto the wafer-level package structure 10 shown in FIG. 1A using an adhesive layer 122', in accordance with some embodiments. In some embodiments, the number of package units 20a is equal to the number of die regions D of the wafer-level package structure 10. In those cases, the second antenna elements 130b may respectively correspond to the die regions D after the package units 20a are bonded onto the wafer-level package structure 10. For example, each die region D includes at least one second antenna element 130b and corresponding to the first antenna element 130a after the bonding of the package units 20a. In those cases, each of the first antenna elements 130a and the corresponding second antenna element 130b form an antenna 130, such as a patch antenna.

In some other embodiments, the number of package units 20a is less than the number of die regions D of the wafer-level package structure 10. In those cases, the package units 20a are respectively bonded to the die regions D that include known good semiconductor dies.

In some embodiments, similar to the wafer-level package structure 10 shown in FIG. 1A, a supporting layer 160 (not shown) is formed on the RDL structure 106 and covers the conductive structures 150 before the package units 20a are bonded onto the wafer-level package structure 10.

In some embodiments, before the package units 20a are bonded onto the wafer-level package structure 10, the adhesive layer 122' is formed on the bottom surface 124a of the encapsulating layer 124', as shown in FIG. 2A. Afterwards, the adhesive layer 122' on the bottom surface 124a of the encapsulating layer 124' is attached to the RDL structure 120 of the wafer-level package structure 10, so as to bond the package units 20a onto the wafer-level package structure 10. After the package units 20a are bonded onto the wafer-level package structure 10, the supporting layer 160 is removed from the RDL structure 106.

Afterwards, a singulation process is performed on the structure shown in FIG. 2B, to form individual semiconductor package structures. More specifically, the wafer-level package structure 10 is diced along the scribe line region S, thereby separating each of the die regions D. After performing the singulation process, individual semiconductor package structures 30a are formed, and one of the semiconductor package structures 30a is depicted for simplifying the diagram, as shown in FIG. 2C. In some other embodiments, the supporting layer 160 is removed from the RDL structure 106 after performing the singulation process.

As shown in FIG. 2C, the semiconductor package structures 30a is similar to the semiconductor package structures 30 shown in FIG. 1D, except that a sidewall of the adhesive layer 122' is substantially aligned to a sidewall of the encapsulating layer 124', and a sidewall of the encapsulating layer 108 laterally protrudes from the sidewall of the encapsulating layer 124'. In some embodiments, the lateral distance d1 between the sidewall of the encapsulating layer 124' and the sidewall of the encapsulating layer 108 is in a range from about 1 μm to about 100 μm.

In some embodiments, before the package units 20a are bonded onto the wafer-level package structure 10, the adhesive layer 122' is formed on and covers the entire surface of the RDL structure 120 of the wafer-level package structure 10. Afterwards, the bottom surface 124a of the encapsulating layer 124' is attached to the adhesive layer 122', so as to bond the package units 20a onto the wafer-level package structure 10. After the bonding of the package units 20a, the adhesive layer 122' and the wafer-level package structure 10 are diced along the scribe line region S, thereby separating each of the die regions D. After performing the singulation process, individual semiconductor package structures 30b are formed, and one of the semiconductor package structures 30b is depicted for simplifying the diagram, as shown in FIG. 3.

Figure 3:
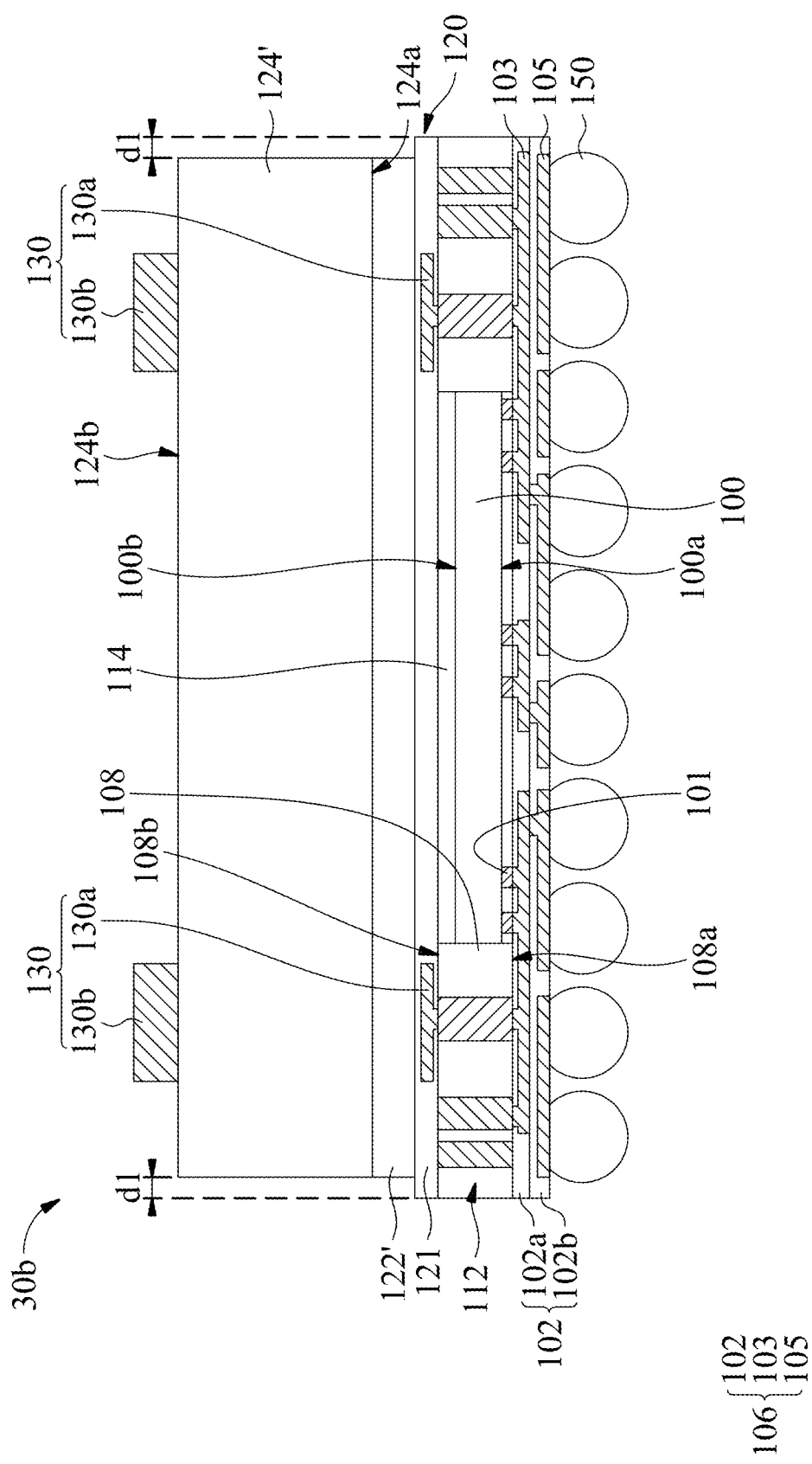
FIG. 3 is a cross-sectional view of an exemplary semiconductor package structure in accordance with some embodiments.

As shown in FIG. 3, the semiconductor package structures 30b is similar to the semiconductor package structures 30a shown in FIG. 2C, except that a sidewall of the adhesive layer 122' is substantially aligned to a sidewall of the encapsulating layer 108, and laterally protrudes from a sidewall of the encapsulating layer 124'. In some embodiments, the lateral distance d1 between the sidewall of the encapsulating layer 124' and the sidewall of the encapsulating layer 108 is in a range from about 1 μm to about 100 μm.

According to the foregoing embodiments, the semiconductor package structure is designed to fabricate a semiconductor package structure having an adhesive layer to bond two encapsulating layers. The upper encapsulating layer serving as a resonator for the patch antenna is formed on the lower encapsulating layer having one or more semiconductor dies therein by a bonding process using an adhesive layer. Compared to the deposition of the upper encapsulating layer on the lower encapsulating layer, the thermal processes used in the fabrication of the semiconductor package structure can be reduced or eliminated. As a result, the warpage of the wafer-level package structure can be mitigated and the number of conductive traces and the number of sub-dielectric layers in the RDL structure can be increased. Since the increase of the conductive traces in the RDL structure, the design flexibility of the semiconductor package structure can be increased.

Moreover, since the upper encapsulating layer is formed on the lower encapsulating layer by a bonding process, a supporting layer, such as a glue layer or a tape, can be used to replace an expensive carrier substrate during the formation of the upper encapsulating layer on the lower encapsulating layer. As a result, both of the manufacture cost and time can be reduced.

In addition, since the package units are respectively bonded to the die regions that include known good semiconductor dies, the number of package units can be less than the number of die regions of the wafer-level package structure. As a result, the manufacture cost can be reduced further.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of forming a semiconductor package structure, comprising:
    providing a first wafer-level package structure having a scribe line region and a die region surrounded by the scribe line region, wherein the first wafer-level package structure comprises:
        a first encapsulating layer having a first surface and a second surface opposite to the first surface;
        a first redistribution layer (RDL) structure formed on the second surface of the first encapsulating layer;
        a first antenna element formed in the first RDL structure and corresponding to the die region; and
        a semiconductor die in the first encapsulating layer and corresponding to the die region;
    bonding a second wafer-level package structure onto the first RDL structure using a first adhesive layer, wherein the second wafer-level package structure comprises:
        a second encapsulating layer having a third surface attached to the first adhesive layer and a fourth surface opposite to the third surface; and
        a second antenna element formed on the fourth surface of the second encapsulating layer, wherein the second antenna element and the first antenna element form a patch antenna after the bonding of the second wafer-level package structure.

2. The method as claimed in claim 1, further comprising dicing the first wafer-level package structure, the second wafer-level package structure, and the first adhesive layer therebetween along the scribe line region.

3. The method as claimed in claim 1, wherein the first wafer-level package structure further comprises:
    a second RDL structure formed on the first surface of the first encapsulating layer; and
    a plurality of conductive structures formed on and electrically coupled to the second RDL structure.

4. The method as claimed in claim 3, further comprising forming a supporting layer on the second RDL structure and covering the plurality of conductive structures before the bonding of the second wafer-level package structure.

5. The method as claimed in claim 1, wherein the first wafer-level package structure further comprises a through via structure and a dipole antenna formed in the first encapsulating layer and corresponding to the die region.

6. The method as claimed in claim 1, wherein the second encapsulating layer is made of a molding compound material.

7. The method as claimed in claim 1, wherein the semiconductor die has a non-active surface attached to the first RDL structure using a second adhesive layer.

8. The method as claimed in claim 1, wherein the third surface of the second encapsulating layer is attached to the first adhesive layer before the bonding of the second wafer-level package structure.

9. The method as claimed in claim 1, wherein the first RDL structure is attached to the first adhesive layer before the bonding of the second wafer-level package structure.

10. A method of forming a semiconductor package structure, comprising:
    providing a wafer-level package structure having a plurality of die regions and a scribe line region separating the plurality of die regions from each other, wherein the wafer-level package structure comprises:
        a first encapsulating layer having a first surface and a second surface opposite to the first surface;
        a first redistribution layer (RDL) structure formed on the second surface of the first encapsulating layer;
        a plurality of semiconductor dies in the first encapsulating layer and respectively corresponding to the plurality of die regions; and
        a plurality of first antenna elements formed in the first RDL structure and respectively corresponding to the plurality of die regions;

bonding at least one package unit onto the first RDL structure using a first adhesive layer, wherein the at least one package unit is within one of the plurality of die regions and comprises:
  a second encapsulating layer having a third surface attached to the first adhesive layer and a fourth surface opposite to the third surface; and
  a second antenna element formed on the fourth surface of the second encapsulating layer, wherein the second antenna element and the first antenna elements form a patch antenna after the bonding of the at least one package unit.

11. The method as claimed in claim 10, further comprising dicing the wafer-level package structure along the scribe line region.

12. The method as claimed in claim 10, wherein the wafer-level package structure further comprises:
  a second RDL structure formed on the first surface of the first encapsulating layer; and
  a plurality of conductive structures formed on and electrically coupled to the second RDL structure.

13. The method as claimed in claim 12, further comprising forming a supporting layer on the second RDL structure and covering the plurality of conductive structures before the bonding of the at least one package unit.

14. The method as claimed in claim 10, wherein the wafer-level package structure further comprises at least one through via structure and at least one dipole antenna formed in the first encapsulating layer.

15. The method as claimed in claim 10, wherein the second encapsulating layer is made of a molding compound material.

16. The method as claimed in claim 10, wherein each of the plurality of semiconductor dies has a non-active surface attached to the first RDL structure using a second adhesive layer.

17. The method as claimed in claim 10, wherein the third surface of the second encapsulating layer is attached to the first adhesive layer before the bonding of the at least one package unit.

18. The method as claimed in claim 10, wherein the first RDL structure is attached to the first adhesive layer before the bonding of the at least one package unit.

19. A semiconductor package structure, comprising:
  a first molding compound material layer having a first surface and a second surface opposite to the first surface;
  a semiconductor die in the first molding compound material layer;
  a first redistribution layer (RDL) structure formed on the second surface of the first molding compound material layer and covering the semiconductor die;
  a second molding compound material layer formed on the first molding compound material layer and having a third surface and a fourth surface opposite to the third surface;
  a first adhesive layer attached to the first RDL structure and the third surface of the second molding compound material layer; and
  a patch antenna electrically coupled to the semiconductor die, comprising:
    a first antenna element formed in the first RDL structure; and
    a second antenna element formed on the fourth surface of the second molding compound material layer.

20. The semiconductor package structure as claimed in claim 19, wherein a sidewall of the first molding compound material layer is substantially aligned to a sidewall of the second molding compound material layer and a sidewall of the first adhesive layer.

21. The semiconductor package structure as claimed in claim 19, wherein a sidewall of the first adhesive layer is substantially aligned to a sidewall of the first molding compound material layer and laterally protrudes from a sidewall of the second molding compound material layer.

22. The semiconductor package structure as claimed in claim 19, wherein a sidewall of the first adhesive layer is substantially aligned to a sidewall of the second molding compound material layer, and wherein a sidewall of the first molding compound material layer laterally protrudes from the sidewall of the second molding compound material layer.

23. The semiconductor package structure as claimed in claim 19, further comprising:
  a second RDL structure formed on the first surface of the first molding compound material layer; and
  a plurality of conductive structures formed on and electrically coupled to the second RDL structure.

24. The semiconductor package structure as claimed in claim 19, further comprising a through via structure and a dipole antenna formed in the first molding compound material layer.

25. The semiconductor package structure as claimed in claim 19, further comprising a second adhesive layer attaching a non-active surface of the semiconductor die to the first RDL structure.

* * * * *